United States Patent [19]

Pottle

[11] 3,943,487
[45] Mar. 9, 1976

[54] INTEGRATED CIRCUIT DIGITAL PATTERN DETECTOR

[75] Inventor: Arthur Richard Pottle, Cheshunt, England

[73] Assignee: AMP Incorporated, Harrisburg, Pa.

[22] Filed: Mar. 27, 1974

[21] Appl. No.: 455,107

[30] Foreign Application Priority Data
Mar. 30, 1973 United Kingdom............... 15388/73

[52] U.S. Cl. ............................ 340/146.2; 29/203 B
[51] Int. Cl.[2] ............................................ G06F 7/04
[58] Field of Search.................. 340/146.2; 307/213; 29/203 B, 577

[56] References Cited
UNITED STATES PATENTS

| | | | |
|---|---|---|---|
| 3,290,756 | 12/1966 | Dreyer............................ | 307/213 X |
| 3,478,314 | 11/1969 | Wedmore ........................ | 340/146.2 |
| 3,760,355 | 9/1973 | Bruckert......................... | 340/146.2 |
| 3,803,697 | 4/1974 | Baker et al....................... | 29/203 B |

*Primary Examiner*—David H. Malzahn
*Attorney, Agent, or Firm*—William J. Keating; Jay L. Seitchik; Frederick W. Raring

[57] ABSTRACT

A logic detect circuit chip is mounted on a substrate having a plurality of first conductors on one surface connected to first inputs of respective bit-gates of the logic circuit, and a plurality of further conductors on the same surface connected to the other inputs of respective bit-gates. The further conductors are traversed by at least one bus conductor on the other surface of the substrate. The further conductors are selectively connectible to each bus conductor by conductive slugs at the crossing points. The bus conductor and the first conductors are connectible respectively to a 0 volt reference line and a parallel binary transmission line. By appropriate selection of the slug connections between further conductors and the bus line the detect circuit may be associated with a particular binary number on the transmission line. Two bus lines may be used, connected respectively to 0 volts and a different voltage reference. The slug connections are suitably made at all cross-over points during manufacture for selective removal to "code" the circuit before use.

24 Claims, 5 Drawing Figures

INTEGRATED CIRCUIT DIGITAL PATTERN DETECTOR

This invention relates to logic circuitry for detecting binary parallel signals.

Increasing interest is being shown particularly in the motor car industry in the use of remote switching systems which will tend to reduce the complexity of modern wiring harnesses. One proposal concerns the use of a multi-conductor cable as a transmission line, for binary parallel switching signals. Each binary parallel signal comprises a plurality of bits each of which is specified by a high or low potential, i.e. a binary logic 1 or 0 which is present on a respective conductor at a particular point in time. The order of the bits in the signal may be defined by the relative positions of the conductors and this has led to an interest in using flat flexible cable carrying parallel spaced conductors as the binary transmission line. The interest in this field has caused a demand for a suitable decoding circuit.

The present invention is a combination of a semi-conductor chip mounted on a planar substrate, the chip bearing a logic detect circuit for detecting binary parallel signals carried in a multi-conductor transmission line, the circuit comprising a plurality of bit gates each of which has two inputs and an output, one of the imputs of each gate being connected to a respective first conductor on one surface of the substrate and the other input of each bit gate being connected to a further respective conductor on the one substrate surface, all the further conductors being traversed by at least one bus conductor disposed on the other surface of the substrate, each further conductor being selectively connectible to the bus conductor by means of a conductive slug at the crossing point of the further conductor and the bus conductor, the bus conductor and the first conductors being connectible, respectively, to a 0 volt reference line and the conductors of the multi-conductor transmission lines.

An embodiment of the invention will now be described, by way of example, with reference to the accompanying drawings in which.

Figure 1:
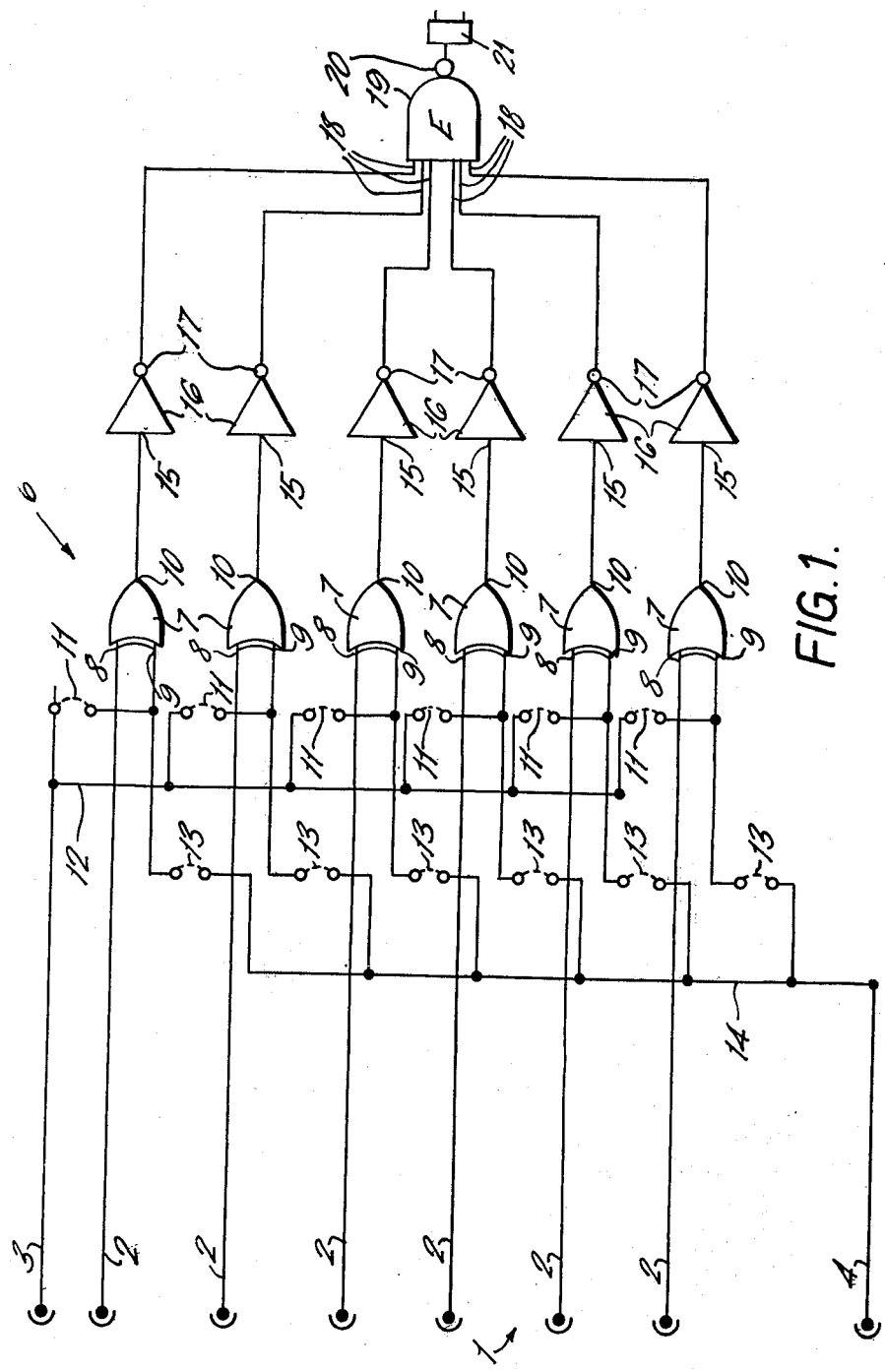
FIG. 1 is a schematic circuit diagram showing a detect circuit connected to a multi-conductor cable.

With reference to FIG. 1, a multi-conductor cable 1 comprises six bit carrying conductors 2, a 5 volt reference conductor 3 and a 0 volt reference conductor 4. The six bit carrying conductors 2 in combination serve as a binary parallel transmission line. The reference conductors 3 and 4 are carried on the same cable 1 only for convenience and may be physically separate from the conductors 2.

The detect circuit 6 comprises six EXCLUSIVE OR gates 7 each of which has an input 8 an input 9 and an output 10. The input 8 of each gate 7 is connected directly to a respective conductor 2 of the transmission line. The input 9 of each gate 7 may be connected to the 5 volt reference conductor 3 through a connection indicated diagrammatically as a jumper 11 and a common bus line 12. The input 9 of each gate 7 may be connected to the 0 volt reference 4 through a connection indicated diagrammatically as a jumper 13 and a common bus line 14.

The output 10 of each gate 7 is connected to an input 15 of respective inverters 16. Each inverter 16 has an output 17 which is connected to respective inputs 18 of a NAND gate 19 the output of which is referenced 20.

In order to personalize the detect circuit described so that it responds to a unique binary parallel signal all that is required is to connect the input 9 of each gate 7 selectively by means of the associated jumper 11 or 13 to either the 5 volt reference conductor 3 or the 0 volt reference conductor 4 according to the particular unique signal. For example, suppose that it is desired to personalize the detect circuit to respond to a binary parallel signal comprising the bits 000101 present respectively on the conductors 2 reading from top to bottom as shown. The input 9 of each of the first three gates 7 reading from the top would be connected to the 0 volt reference conductor 4, the input 9 of the next gate 7 down would be connected to the 5 volt reference conductor 3, the input 9 of the next gate 7 down would be connected to the conductor 4, and the input 9 of the last gate 7 would be connected to the conductor 3.

If the unique binary signal 000101 is present on the transmission line, the first gate 7 from the top has binary logic 0 signal at both inputs 8 and 9, and because of the inherent nature of an EXCLUSIVE OR gate a binary logic 0 is derived at its output 10. The 0 signal is inverted in the associated inverter 16 so that a 1 signal is present on the respective input 18 of the NAND gate 19. Similarly, a 1 signal is present on the inputs 18 corresponding to the next two EXCLUSIVE OR gates 7.

The fourth gate 7 from the top has binary logic 1 signals at both inputs 8 and 9, and because of the inherent nature of an EXCLUSIVE OR gate a binary logic 0 is derived at its output 10. This signal is then inverted and applied to the respective input 18 of the NAND gate 19 as a 1. Similarly, the two inputs of the fifth gate 7 read a binary logic 0 causing a 1 to appear at the respective inputs 18 of the NAND gate 19. Similarly, the two inputs of the sixth gate 7 read a binary logic 1 causing a 1 to appear at the respective inputs 18 of the NAND gate 19. Because a binary logic 1 appears on all the inputs 18 of the NAND gate 19 and because of the inherent nature of a NAND gate a binary logic 0 is derived at its output 20. If the unique binary signal is not present then a binary logic 1 is derived at the output 10 of at least one of the gates 7, this signal being inverted to a logic 0 at the respective input 18 of the NAND gate 19. This causes a logic 1 to appear at the output 20.

The output 20 of the NAND gate is used to drive a flip flop 21, the flip flop energizing an associated steady voltage circuit (not shown) only when a logic 0 is present on the output 20.

The detect circuit described is intended to detect a 6 bit binary parallel signal and to this end makes use of 6 bit gates 7. Clearly, if the number of bits to be read were greater or less than six the number of gates 7 would be increased or decreased correspondingly.

The circuit described is, of course, merely exemplary. An alternative circuit envisaged is one in which the inverters 16 are dispensed with, the outputs 10 of the gates 7 being directly connected to the inputs 18 of the NAND gate 19. In order that this circuit should read the binary signal 000101 the input 9 of each of the first three gates 7 from the top would be connected to the 5 volt reference conductor 3, the input 9 of the next gate 7 would be connected to the 0 volt reference conductor 4, the input 9 of the next gate 7 would be connected to the conductor 3, and the input 9 of the last gate connected to the conductor 4. If the binary signal 000101 is present on the transmission line it is clear that each gate 7 has two different logic signals at its imputs and because of the inherent nature of an EXCLUSIVE OR gate a binary logic 1 is derived at all the outputs. Thus a binary logic 1 appears on all the inputs 18 of the NAND gate 19 as with the first circuit; the remainder of the detect operation is identical with the first circuit.

The gates 7 can thus be used to produce a predetermined logic signal at the respective outputs providing the inputs are matched, i.e. either when the logic signals present on both respective inputs are the same (as in the case of the first circuit) or when the logic signals present on both respective inputs are different (as in the case of the second circuit).

Figure 2:
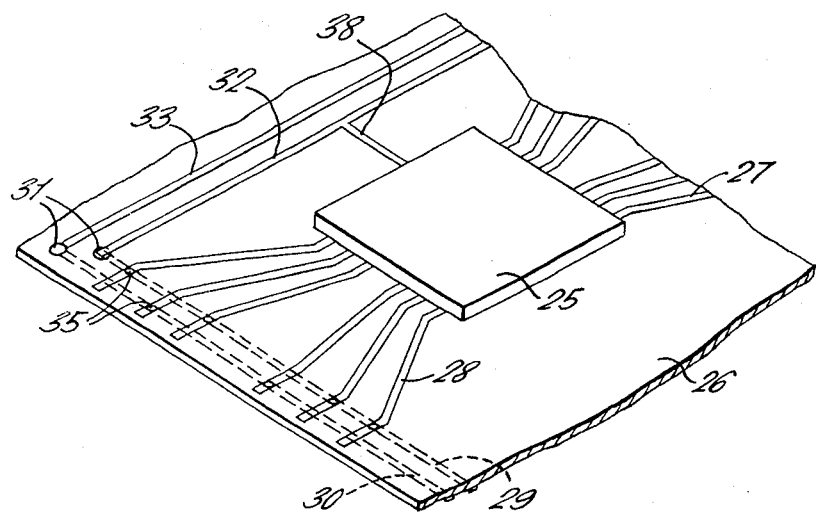
FIG. 2 is a fragmentary perspective view showing a semi-conductor chip incorporating the detect circuit of FIG. 1 and mounted on a flat printed circuit designed for selective connection to two reference conductors according to FIG. 1.

With reference now to FIG. 2, a semi-conductor chip 25 is shown mounted on a flat flexible circuit 26. The chip 25 contains the circuit components 7, 16, 19 and 21 interconnected as shown in FIG. 1. The chip has contact pads on its underside in respective engagement with six conductive strips 27 and a further six conductive strips 28 on the upper surface of the flexible circuit 26.

The contact pads with which the strips 27 are in contact correspond, respectively, to the inputs 8 of the gates 7 shown in FIG. 1; the function of the strips 27 being to interconnect the conductors 2 of the transmission line to the inputs 8 of the gates 7.

The contact pads with which the strips 28 are in contact correspond, respectively, to the inputs 9 of the gates 7 shown in FIG. 1. The strips 28 have parallel spaced end portions which are crossed at right angles by two parallel spaced conductive strips 29 and 30 disposed on the underside of the flexible circuit 26. The strips 29 and 30 are connected respectively by conductive plugs 31 extending through the flexible circuit 26 to two parallel conductive strips 32 and 33 disposed on the upper side of the flexible circuit 26 at right angles to the strips 29 and 30.

The strips 32 and 33 correspond respectively to the bus lines 14 and 12 of FIG. 1 and are intended for connection respectively to the 0 volt reference conductor 4 and the 5 volt reference conductor 3. Thus the crossing points of each strip 28 with the strips 29 and 30 correspond respectively with the connections 13 and 11 of FIG. 1. A connection is provided selectively by means of a conductive plug 35 to either the strip 29 or 30 according to the particular coding required as described with reference to FIG. 1. The plug 35 is made by drilling a hole at the desired crossing point and then filling the hole with metal, e.g. by a plating technique.

The strip 32 has a branch 38 meeting a conductive pad (not shown) on the underside of the chip.

The flexible circuit 26 may be connected to the transmission line 1 by any suitable technique depending, inter alia, on the physical nature of the transmission line. For example, if a flat flexible circuit were used in which the conductors 2, 3 and 4 are deposited on one side, this could be laid over an edge portion of the flexible circuit 26 and the conductors 2, 3 and 4 connected respectively to the strips 27, 33 and 32 by a through hole plating technique or by staking with conductive pins.

Figure 3:
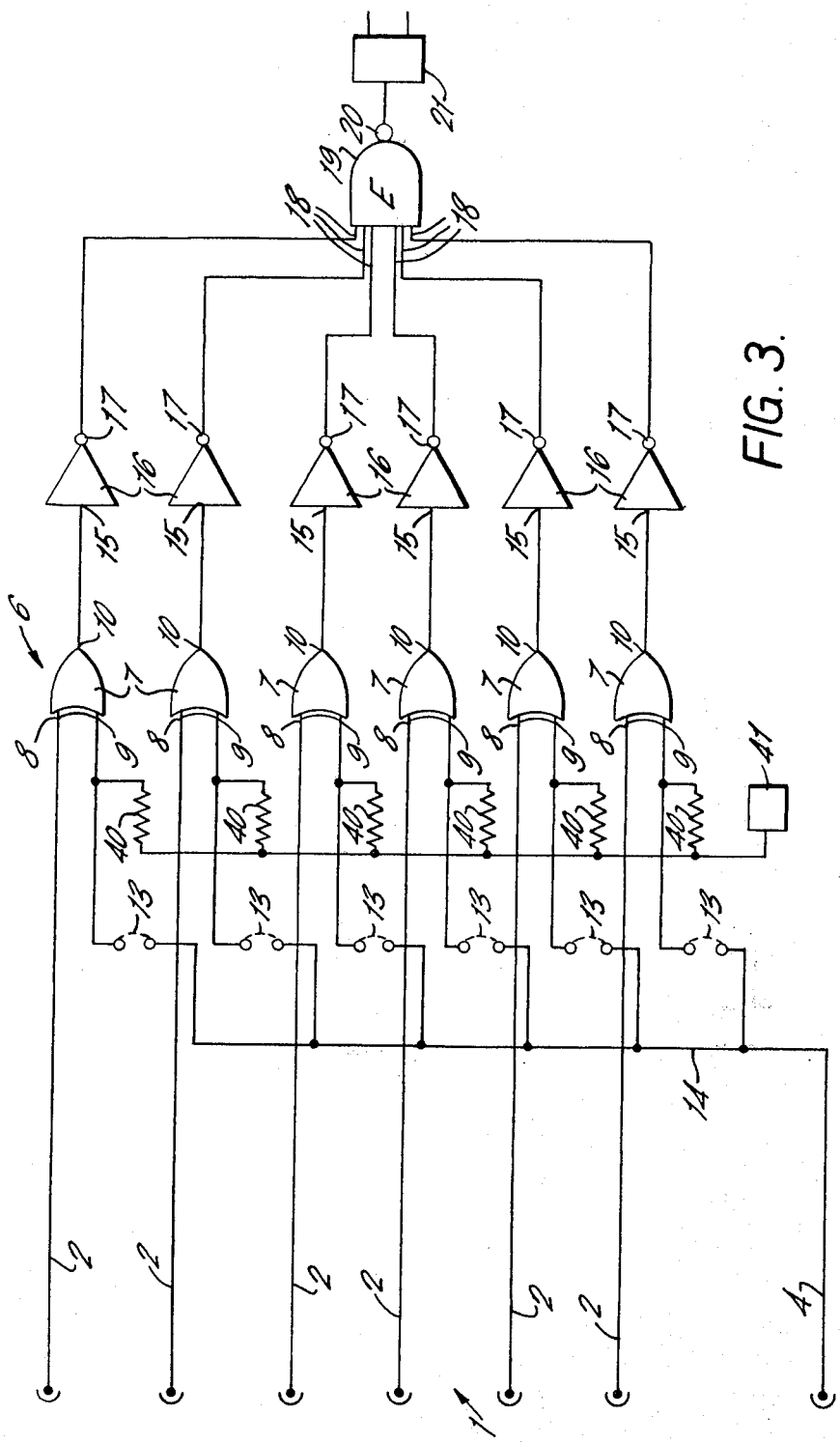
FIG. 3 is a schematic circuit diagram showing a modified detect circuit connected to a multi-conductor cable.

With reference to FIG. 3 and comparing it to FIG. 1, the transmission line is identical except that five volt line 3 is omitted. Because the line 3 is omitted there are no counterparts in the detector circuit to the bus line 12 and the jumpers 11. The inputs 9 of the gates 7 are, as before, connected through jumpers 13 to a bus line 14 connected to the 0 volt reference line. The inputs 9 are also connected through respective resistors 40 to a 5 volt source 41. The remainder of the detect circuit is identical with the circuit of FIG. 1.

As before, in order to personalize the detect circuit so that it responds to a unique binary parallel signal the input 9 of each gate 7 must be biased selectively by 0 volts or 5 volts according to the unique signal. The inputs 9 are all permanently connected through the resistors 40 to the 5 volt source so that the initial bias to each input 9 is 5 volts. If the associated jumper 13 is connected, a voltage drop of 5 volts appears across the associated resistor and the associated input goes to 0 volts.

Figure 4:
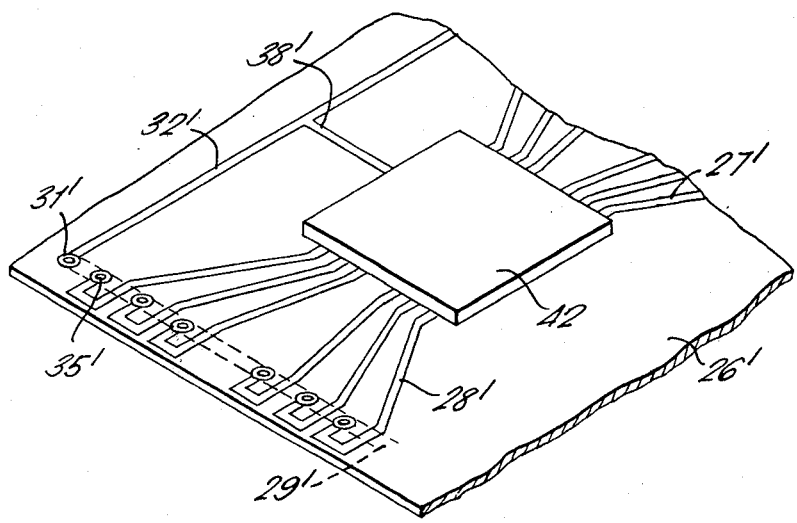
FIG. 4 is a fragmentary perspective view showing a semi-conductor chip incorporating the detect circuit of FIG. 1 and mounted on a flat printed circuit designed for selective connection to the single reference conductor according to FIG. 3.

FIG. 4 is similar to FIG. 2 and like parts are indicated with like references but with a prime notation in FIG. 4. As with the chip 25 the chip 42 contains the circuit components 7, 16, 19 and 21 interconnected as shown in FIGS. 1 or 3, but the chip 26 also contains the resistors 40 connecting a 5 volt source in the chip to the gate inputs 9. The flat flexible circuit 26' lacks an equivalent to the conductive strip 30 and the conductive strip 33. The strips 28' are all shown connected to the strip 29' by plated through holes 35'. This means that the gate inputs 9 are all connected for biasing by the 0 volt reference line. In order to bias a particular gate 9 by the 5 volt source the appropriate plated through hole 35' may be drilled out or the appropriate strip 28' may be cut or punched out at the section parallel with the edge of the flat flexible circuit 26' to break connection between the appropriate strip 28' and the strip 29'

Figure 5:
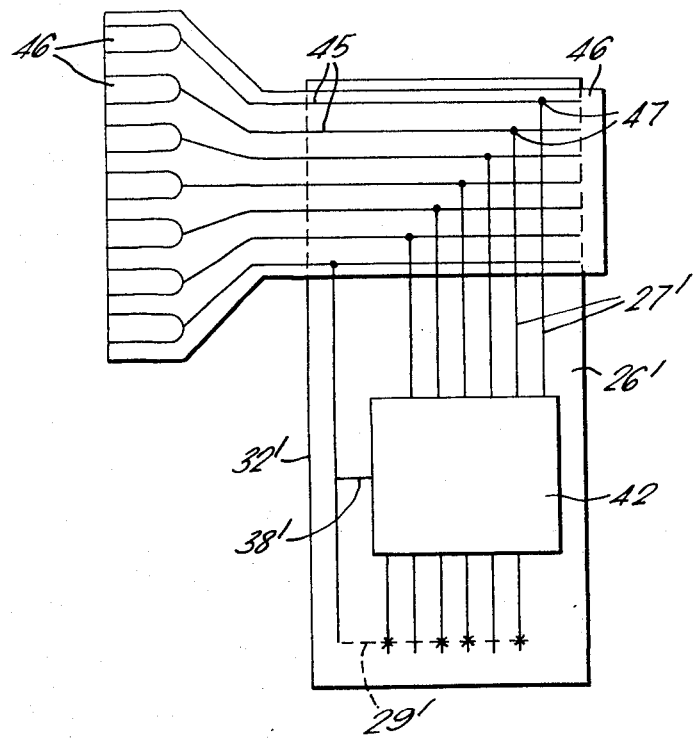
FIG. 5 is a diagrammatic view of the combination of FIG. 4 mounted on a further substrate.

With reference to FIG. 5, the flexible circuit 26' of FIG. 4 is shown to be partly overlain and bonded to a further flat flexible circuit 44 comprising a transparent substrate having on one side, the upper as shown in FIG. 5, a plurality of parallel conductors 45 terminating in edge contact pads 46. The conductors 45 traverse the conductors 27' and the strip 32' and are connected respectively to these conductors by pins 47 passing through the two substrates. The flexible circuit 44 may be connected to a multi-conductor transmission line by interconnecting the pads 46 in any suitable manner to the individual conductors 2 and 4 of the transmission line.

What is claimed is:

1. A code detector, which comprises, in combination,
   1. an electrically insulating substrate having a first plurality of input conductors and a second plurality of input conductors formed on one surface of said substrate, 2. a semiconductor chip bearing a logical detecting circuit mounted on the said one surface of said substrate, said chip having input contact regions coupled respectively to said first and second input conductors,
3. a reference conductor formed on the other surface of said substrate, said reference conductor crossing each of said second plurality of input conductors and spaced therefrom by said substrate,
4. means to selectively couple predetermined ones of said second conductors to said reference conductor, and
5. means coupling said reference conductor to a reference contact region on said chip.

2. A code detector as set forth in claim 1 wherein said logical detecting circuit includes a plurality of input logic gates, each gate having two inputs, one of said inputs being coupled to one of said first plurality of input conductors and the second input being coupled to one of said second plurality of input conductors.

3. A code detector as set forth in claim 1 wherein said means to selectively couple comprises an aperture in said substrate between said reference conductor and said selected second conductors and electrically conductive means in said apertures interconnecting said reference conductor and each said selected second conductor.

4. A code detector as set forth in claim 3 wherein said logical detecting circuit includes a plurality of input logic gates, each gate having two inputs, one of said inputs being coupled to one of said first plurality of input conductors and the second input being coupled to one of said second plurality of input conductors.

5. A code detector as set forth in claim 3 wherein said electrically conducting means is a removable slug.

6. A code detector as set forth in claim 5 wherein said logical detecting circuit includes a plurality of input logic gates, each gate having two inputs, one of said inputs being coupled to one of said first plurality of input conductors and the second input being coupled to one of said second plurality of input conductors.

7. A code detector as set forth in claim 1 wherein said substrate is flexible.

8. A code detector as set forth in claim 7 wherein said logical detecting circuit includes a plurality of input logic gates, each gate having two inputs, one of said inputs being coupled to one of said first plurality of input conductors and the second input being coupled to one of said second plurality of input conductors.

9. A code detector as set forth in claim 7 wherein said means to selectively couple comprises an aperture in said substrate between said reference conductor and said selected second conductors and electrically conductive means in said apertures interconnecting said reference conductor and each said selected second conductor.

10. A code detector as set forth in claim 9 wherein said logical detecting circuit includes a plurality of input logic gates, each gate having two inputs, one of said inputs being coupled to one of said first plurality of input conductors and the second input being coupled to one of said second plurality of input conductors.

11. A code detector as set forth in claim 9 wherein said electrically conductive means is a removable slug.

12. A code detector as set forth in claim 11 wherein said logical detecting circuit includes a plurality of input logic gates, each gate having two inputs, one of said inputs being coupled to one of said first plurality of input conductors and the second input being coupled to one of said second plurality of input conductors.

13. A code detector as set forth in claim 1 further including a power conductor formed on the other surface of said substrate, said power conductor crossing each of said second plurality of input conductors and spaced therefrom by said substrate and means to selectively couple predetermined ones of said second conductors to said power conductor.

14. A code detector as set forth in claim 13 wherein said logical detecting circuit includes a plurality of input logic gates, each gate having two inputs, one of said inputs being coupled to one of said first plurality of input conductors and the second input being coupled to one of said second plurality of input conductors.

15. A code detector as set forth in claim 13 wherein each of said means to selectively couple comprises an aperture in said substrate between said reference conductor and said selected second conductors and between said power conductor and said selected conductors and electrically conductive means in said apertures interconnecting said reference conductor, said power conductor and each of said selected second conductors.

16. A code detector as set forth in claim 15 wherein said logical detecting circuit includes a plurality of input logic gates, each gate having two inputs, one of said inputs being coupled to one of said first plurality of input conductors and the second input being coupled to one of said second plurality of input conductors.

17. A code detector as set forth in claim 15 wherein said electrically conductive means is a removable slug.

18. A code detector as set forth in claim 17 wherein said logical detecting circuit includes a plurality of input logic gates, each gate having two inputs, one of said inputs being coupled to one of said first plurality of input conductors and the second input being coupled to one of said second plurality of input conductors.

19. A code detector as set forth in claim 13 wherein said substrate is flexible.

20. A code detector as set forth in claim 19 wherein said logical detecting circuit includes a plurality of input logic gates, each gate having two inputs, one of said inputs being coupled to one of said first plurality of input conductors and the second input being coupled to one of said second plurality of input conductors.

21. A code detector as set forth in claim 19 wherein each of said means to selectively couple comprises an aperture in said substrate between said reference conductor and said selected second conductors and between said power conductor and said selected conductors and electrically conductive means in said apertures interconnecting said reference conductor, said power conductor and each of said selected second conductors.

22. A code detector as set forth in claim 21 wherein said logical detecting circuit includes a plurality of input logic gates, each gate having two inputs, one of said inputs being coupled to one of said first plurality of input conductors and the second input being coupled to one of said second plurality of input conductors.

23. A code detector as set forth in claim 21 wherein said electrically conductive means is a removable slug.

24. A code detector as set forth in claim 23 wherein said logical detecting circuit includes a plurality of input logic gates, each gate having two inputs, one of said inputs being coupled to one of said first plurality of input conductors and the second input being coupled to one of said second plurality of input conductors.

* * * * *